TAPPED EMITTER FLIP-FLOP

Filed April 30, 1964

INVENTORS
Jan A. Narud
Walter C. Seelbach
BY
[signature]
ATT'YS

United States Patent Office 3,317,750 Patented May 2, 1967

3,317,750
TAPPED EMITTER FLIP-FLOP

Jan A. Narud and Walter C. Seelbach, Scottsdale, Ariz., assignors to Motorola, Inc., Chicago, Ill., a corporation of Illinois Filed Apr. 30, 1964, Ser. No. 363,959
9 Claims. (Cl. 307—88.5)

Figure 1:
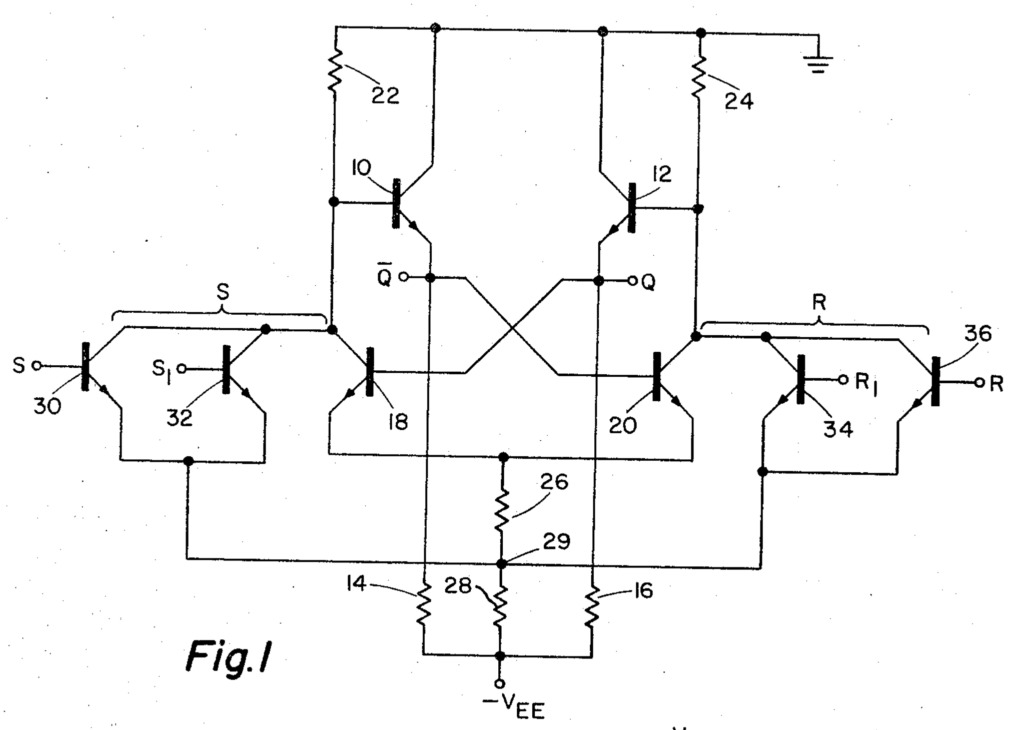

The present invention relates to bi-stable multivibrators, and it relates more particularly to an improved transistorized bi-stable multivibrator which may be of the integrated circuit type.

Integrated circuits involve the use of a substrate of semi-conductor material, and the creation of fused junctions in the substrate to constitute transistors, diodes, and the like. Other circuit elements, such as resistors, capacitors and electrical conductors may also be formed on the substrate.

Copending application Ser. No. 273,033, now abandoned, filed April. 15, 1963, and assigned to the present assignee, described certain systems and circuits which have been conceived to utilize the inherent advantages of integrated circuit construction and to eliminate in one way or another any of its inherent disadvantages.

Among the circuits described in the aforementioned copending application is a bi-stable multivibrator. The bi-stable multivibrator of the present invention is of the same general type as disclosed in the copending case.

The logic circuitry forming the basis of the circuits described in the copending case and of the present invention involves emitter coupled cathode follower logic stages.

The emitter coupled logic utlized in the bi-stable multivibrator to be described herein serves to reduce parasitic coupling between the various portions of the circuit, when the multivibrator is constructed as an integrated circuit. Such parasitic coupling, as explained in the copending application, tends to reduce the operational response speed of the multivibrator.

Moreover, the emitter coupled logic utilized in the multivibrator to be described serves to overcome the normal sensitivity of integrated circuits to changes in ambient conditions.

As is well known, the bi-stable multivibrator is widely used in present day electronic computers, data processors, and other electronic equipment. The bi-stable multivibrator is usually referred to as a flip-flop. The multivibrator is an Eccles-Jordan relaxation oscillator. It may be transistorized, and incorporated in an integrated circuit, as is the case with the particular bi-stable multivibrator to be described.

The two stable states of the bi-stable multivibrator are conventionally referred to as the "set" and "reset" states. The multivibrator is usually triggered to its set state by a set input signal applied to appropriate input gate circuitry in the multivibrator. The bi-stable multivibrator then remains in its set state until a "reset" signal is applied to appropriate reset gate circuitry included in the multivibrator.

The bi-stable multivibrator to be described is also adaptable to toggle action, this being achieved by the inclusion of appropriate "steering" networks in the multivibrator circuit. The steering network permits successive clock pulses applied to a single input terminal to trigger the multivibrator successively between its set and reset states.

As mentioned previously, herein, the bi-stable multivibrator of the present invention may be constructed to incorporate a high speed integrated circuit logic blocks of the emitter coupled type. These logic blocks, as noted, capitalize on integrated circut advantages and compensate for their limitations. The integrated circuit logic blocks utilized in the multivibrator are reliable and relatively insensitive to variations in component values. Also, the tolerance requirements are relatively large, so as to facilitate construction techniques. Moreover, the propagation time through the particular logic blocks is relatively small, and power dissipation may be maintained at a minimum.

The bi-stable multivibrator of the present invention as noted above is of the same general type described in the copending application. However, it requires lower power than the particular multivibrator described therein, and than the prior art multivibrator in general, for a given switching ability. In addition, it requires fewer component parts to perform its bi-stable function.

The bi-stable multivibrator to be described utilizes, as mentioned above, emitter coupled logic. A tapped resistor is used to provide triggering at one-half the logic swing, for example, for optimum noise immunity for a selected amplitude sensitivity.

An object of the present invention, therefore, is to provide an improved bi-stable multivibator of the emitter coupled logic type, and which is particularly adapted to be constructed so as to incorporate integrated circuit emitter coupled logic blocks.

Another object of the invention is to provide such an improved flip-flop which has a direct set-reset capability.

Yet another object is to provide such an improved multivibrator which utilizes a minimum of components parts, and which may be constructed on a relatively simple and economical basis.

A still further object of the invention is to provide such an improved bi-stable multivibrator which is capable of relatively high speed operation for use in present day high speed digital computers, and a relatively low power consumption level.

A feature of the invention is the provision of such an improved bi-stable multivibrator which incorporates a tapped emitter resistor to provide the logic level shift so as to cause triggering when the amplitude of the trigger signal equals one half its logic swing, for optimum noise immunity for a given amplitude sensitivity.

Figure 2:
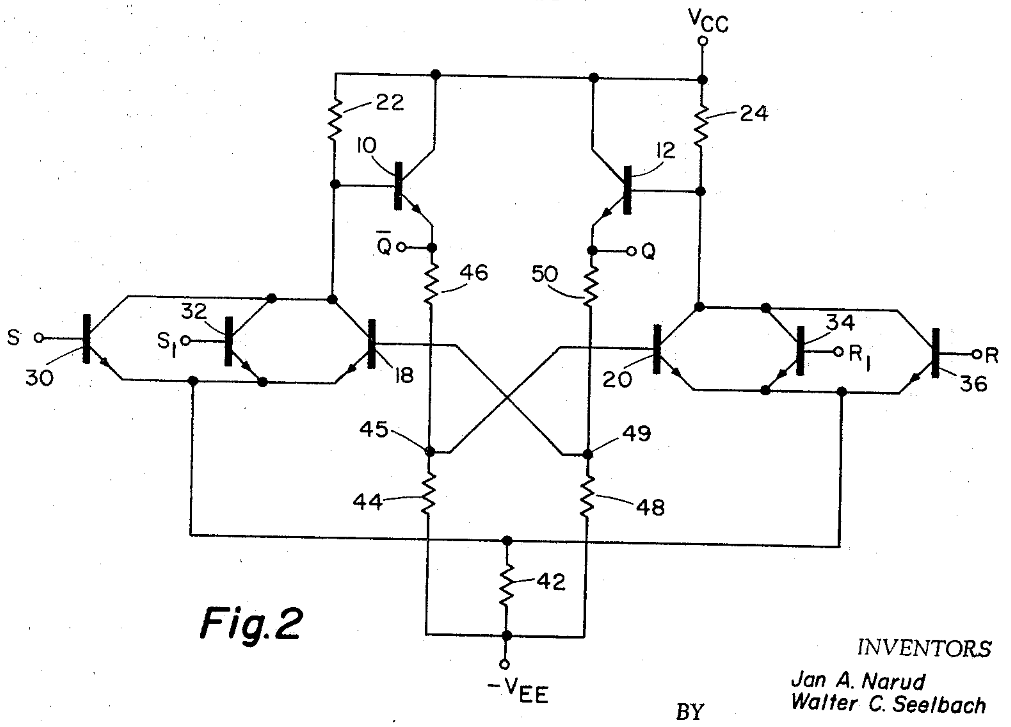

Other objects, features and advantages of the invention will become apparent from a consideration from the following specification, when the specification is considered in conjunction with the accompanying drawing, in which;

FIG. 1 illustrates one embodiment of the bistable multivibrator of the present invention; and FIG. 2 illustrates an alternative embodiment of the configuration of FIG. 1.

The bi-stable multivibrator illustrated in FIG. 1 includes a pair of transistors 10 and 12 which form a portion of the bi-stable multivibrator circuit. These transistors, and the others to be described, may be of the silicon diffused junction NPN type, and may be formed on a common substrate, in accordance with usual integrated circuit techniques.

The transistors 10 and 12 are connected as emitter followers, the collectors of the transistors being grounded, and the emitters being connected through respective 2 kilo-ohm resistors 14 and 16 to the negative terminal of a source $V_{EE}$ of direct current potential. The positive terminal of the source is grounded. The output terminals Q and $\overline{Q}$ are connected to the respective emitters.

The multivibrator circuit also includes a further pair of NPN transistors 18 and 20. The latter transistors serve to cross-couple multivibrator transistors 10 and 12. To that end, the base of the transistor 20 is connected to the emitter of the transistor 10, and its collector is connected to the base of the transistor 12. Conversely, the base of the transistor 18 is connected to the emitter of the transistor 12, and its collector is connected to the base of the transistor 10.

Appropriate bias is applied to the base of the transistor 10 and to the base of the transistor 12 by respective 270 ohm grounded resistors 22 and 24.

The emitters of the transistors 18 and 20 are connected to a common tapped resistor, designated by a pair of series connected resistors 26 and 28, these being connected to the negative terminal of the direct voltage source. The resistor 26 may have a resistance of 130 ohms, and the resistor 28 may have a resistance of 1.1 kilo-ohms.

The multivibrator circuit includes a set "or" gate, this gate being formed of a pair of NPN transistors 30 and 32. The emitters of the set gate transistors are connected to the junction of the resistors 26 and 28, and the collectors are connected to the base of the transistor 10.

The set input signal S is applied to the base of the transistor 30. A further set input signal $S_1$ may be applied to the base of the transistor 32. Either of these signals is capable of triggering the multivibrator from its reset state to its set state.

The transistor circuit also includes a reset "or" gate which, in turn, includes a pair of NPN transistors 34 and 36. The emitters of the latter transistors are connected to the same junction of the resistors 26 and 28 as the emitters of the transistors 30 and 32. The collectors of the transistors 34 and 36 of the reset gate are connected to the base of the transistor 12.

The reset signal R is applied to the base of the transistor 36. A further reset signal $R_1$ may be applied to the base of the transistor 34. Either of these reset signals is able to reset the multivibrator.

In describing the operation of the multivibrator circuit, it will be assumed that it is initially in its set state. The following conditions and exemplary voltage levels are established during the set state of the multivibrator.

The transistor 20 is non-conductive and the transistor 18 is conductive.

The zero voltage on the base of the transistor 12 produces a voltage of −0.7 volt on its emitter, due to the offset voltage of the transistor. Likewise, there is −0.8 volt on the base of the transistor 10 and −1.5 volts on its emitter. During this condition the output $\overline{Q}$ is a "0" (−1.5 v.) and the output Q is a "1" (−0.7 v.). The common emitters of the transistors 18 and 20 are at −1.4 volts. The tap point 29 is at −1.8 volts.

Now as the reset input signal R shifts from the −1.5 volt towards the −0.7 volt level, and as the reset input signal R shifts past the 50% (−1.1 v.) level, the transistor 36 becomes conductive. This causes the collectors of the transistors 20 and 36 and the base of the transistor 12 to swing negative. Due to the emitter follower connection, the emitter of the transistor 12 follows the base voltage in the negative direction. This reduces the current through the transistor 18 and causes the base potential of the transistor 10 to rise toward 0. As the emitter of the transistor 10 follows its base, the base of the transistor 20 is also raised so that the transistor 20 becomes biased for conduction. However, so long as the base of the transistor 36 is at the −0.7 volt level the current through the tap point 29 is hogged by transistor 36 since it has 1.1 volts bias from emitter to base whereas transistor 20 will have only 0.7 volt from emitter to base in the reset state.

As the reset signal shifts back in the negative direction, the transistor 20 "catches" the current and holds the flip-flop in the reset state. When the reset signal reaches the −1.1 volt level, the current through the tap point 29 divides such that approximately half of it flows through each of the transistors 20 and 36. All current flows through transistor 20 when the reset signal reaches the −1.5 volt level.

The multivibrator, therefore, is capable of responding to a direct reset signal, as the signal shifts its logic level from one value to the other. As described, the tapped connection to the emitter resistors 26 and 28 permits the multivibrator to shift its state when the reset signal amplitude passes through one half of its logic swing. This provides for optimum noise immunity for a given reset signal amplitude because voltage of at least half that amplitude must be present on the base of the reset transistor to switch it in either direction. In order to make the switching threshold half of the logic swing, the value of resistance 26 should be half that of resistance 22. Resistances 22 and 24 may be equal. In this case, resistances 14 and 16 have the same value as resistances 22 and 24.

An alternative way to set the threshold at half the logic swing is to tap the emitter resistors of the output transistors 10 and 12 and connect the bases of the holding transistors to this tap point. An alternative embodiment of this configuration is shown in FIG. 2, and since the circuit is similar to FIG. 1, the same reference numerals have been applied to like parts. The transistors 18, 20, 30, 32, 34 and 36 have a common emitter resistor 42 which is connected to the negative potential supply terminal $-V_{EE}$. The base of the holding transistor 18 on the set side is connected to a tap point 49 between the resistors 48 and 50 in the emitter circuit of the output transistor 12. Likewise, the base of the holding transistor 20 on the reset side is connected to a tap point 45 between resistors 44 and 46 in the emitter circuit of the other output transistor 10.

Assuming that the flip-flop of FIG. 2 is in its set state, transistors 10 and 18 are conducting, and all other transistors are off except the output transistor 12 which is also conducting. If the positive potential supply terminal $V_{CC}$ is at ground potential, the base of transistor 12 is at 0 volt and its emitter is at −0.7 volt providing a binary one output at output terminal Q. A binary zero (−1.5 volts) appears at the other output terminal Q, and transistor 10 has −1.5 volts at its emitter and −0.8 volt at its base. The resistor 46 has a value such that the voltage drop across it is one-half of a logic swing, so the tap point 45 and the base of transistor 20 are at −1.9 volts. Similarly, the voltage drop across resistor 50 is half of the logic swing, so the voltage at the tap point 49 and the base of transistor 18 is −1.1 volts. The voltage at the positive side of resistor 42 stays at −1.8 volts regardless of which state the flip-flop is in. Thus, there is 0.7 volt from the emitter to the base of transistor 18 which is conducting, and there is a reverse bias of 0.1 volt between the emitter and base of transistor 20 which makes that transistor non-conductive.

When the base of transistor 36 shifts from −1.5 volts to −0.7 volt in response to a reset signal, transistor 36 has 1.1 volts from emitter to base. Since it then has more positive bias across its emitter junction than thansistor 18, the constant current through resistor 42 shifts from transistor 18 to transistor 36. The reset signal has overridden the feedback currents such that transistor 36 hogs all of the current while the reset signal is present. The reset signal causes the base and emitter of transistor 12 to swing in the negative direction, and the voltage at tap point 49 shifts from −1.1 volts to −1.9 volts. The latter voltage appears on the base of transitor 18 and turns that transistor off. Transistor 10 then has 0 volts on its base and −0.7 volt on its emitter, so the voltage at tap point 45 shifts to the −1.1 volts level and this voltage appears on the base of transistor 20. When the reset signal goes negative and reaches −1.1 volts, the current will be divided equally between transistors 20 and 36 since transistor 20 and transistor 36 then both have an emitter-base bias of 0.7 volt (1.8 volts −1.1 volts). As the conduction of transistor 36 decreases, the current shifts to transistor 20 which holds the flip-flop in the reset state.

The invention provides, therefore, an improved and simplified bi-stable multivibrator circuit which is particularly adapted to integrated circuit construction. The multivibrator is particularly advantageous because of its simplicity and minimum component requirement. Power consumption is reduced by setting the switching threshold of the multivibrator internally, and this may be accomplished either by tapping the common emitter resistance for the hold transistors or by tapping the emitter resistance of the output transistors in the manner described herein.

The multivibrator provides a direct set-reset capability. It requires relatively low power and is fast acting. It also exhibits a high degee of noise immunity.

While a particular embodiment of the invention has been shown and described, modifications may be made, and it is intended in the claims to cover such modifications as fall within the spirit and scope of the invention.

What is claimed is.

1. A bi-stable multivibrator including in combination, first and second emitter follower transistor circuits each including an output transistor, a resistance connected in series with the emitter of said output transistor, and an output circuit portion connected to the emitter of said output transistor and to said resistance; first and second holding transistor circuits each including a holding transistor having a collector connected to the base of one of said output transistors and having a base cross-connected to the emitter circuit of the other of said output transistors; first and second triggering circuits each including a triggering transistor having the emitter-to-collector path thereof connected between the emitter and collector of a corresponding one of said holding transistors, and an input circuit portion connected to the base of said triggering transistor; and a resistance connected to the emitters of said holding transistors providing a common current supply path for the same, one of said resistances having an intermediate connection therein serving to establish the switching threshold of said multivibrator at a level substantially midway between the extremes of output voltage supplied at said output circuit portions in the operation of said multivibrator.

2. A bi-stable multivibrator including in combination, first and second emitter follower transistor circuits each including an output transistor, a resistance connected in series with the emitter of said output transistor, and an output circuit portion connected to the emitter of said output transitor and to said resistance; first and second holding transistor circuits each including a holding transistor having a collector connected to the base of one of said output transistors and having a base cross-connected to the emitter circuit of the other of said output transistors; first and second triggering circuits each including a triggering transistor having the emitter-to-collector path thereof connected between the emitter and collector of a corresponding one of said holding transistors, and an input circuit portion connected to the base of said triggering transistor; resistance means connected to the emitters of said holding transistors providing a common current supply path for the same; and means connecting an intermediate portion of said resistance means to the emitters of said triggering transistors for establishing the switching threshold of said multivibrator at a level midway between the extremes of output voltage supplied at said output circuit portions in the operation of said multivibrator.

3. A bi-stable multivibrator including in combination, first and second emitter follower transistor circuits each including an output transistor, a resistance connected in series with the emitter of said output transistor, and an output circuit portion connected to the emitter of said output transistor and to said resistance; first and second holding transistor circuits each including a holding transistor having a collector connected to the base of one of said output transistors and having a base cross-connected to an intermediate portion of the resistance in series with the emitter of the other of said output transistors to establish the switching threshold of said multivibrator at a level substantially midway between the output voltage levels of said multivibrator; first and second triggering circuits each including a triggering transistor having the emitter-to-collector path thereof connected between the emitter and collector of a corresponding one of said holding transistors, and an input circuit portion connected to the base of said triggering transistor; and resistance means connected to the emitters of said holding transistors and said triggering transistors providing a common current supply path for the same.

4. A bistable multivibrator constructed as an integrated circuit semiconductor device, said multivibrator having set and reset conductive states and including in combination, first and second signal output transistor portions and first and second holding transistor portions, means cross coupling said first and second signal output transistor portions respectively to said second and first holding transistor portions and providing a current path through said multivibrator during the alternate conduction of said first and second holding transistor portions in the set and reset states of said multivibrator, set and reset input transistors D.C. coupled directly in parallel respectively with said first and second holding transistor portions and connected to receive respectively set and reset binary logic signals for changing the conductive state of said multivibrator, said binary logic signals applied to said set and reset input circuit means having upper and lower voltage levels defining a logic swing, and bias circuit means connected to said first and second holding transistor portions and to said set and reset input transistors for biasing said set and reset input transistors at predetermined bias voltage levels; one of said set and reset transistors being biased into conduction in response to binary logic signals applied thereto which reach a predetermined percentage of said logic swing and override the first and second holding transistors, whereby current is hogged entirely from the previously conducting holding transistor by one of said set and reset input transistors to which said binary logic signals above said predetermined logic level are applied, imparting to said multivibrator an input override capability; the one of said first and second holding transistors which had previously been non-conducting being biased into conduction when said binary logic signals drop below said predetermined logic level.

5. A bistable multivibrator having set and reset conductive states and including in combination, first and second emitter follower transistors and first and second holding transistors, said first and second holding transistors being connected to a common current point, means cross coupling said first and second emitter follower transistors respectively to said second and first holding transistors and providing a conductive path in said multivibrator during the alternate conduction of said first and second holding transistors, set and reset input circuit means connected respectively to said first and second holding transistors, said set input circuit means including a first triggering transistor connected in parallel with said first holding transistor, and said reset input circuit means including a second triggering transistor connected in parallel with said second holding transistor, said first and second triggering transistors being adapted to receive set and reset binary logic signals having predetermined upper and lower voltage levels defining a logic swing, resistive bias circuit means connected to said first and second triggering transistors for biasing the same at a predetermined voltage level so that said triggering transistors will conduct only in response to logic signals applied thereto which reach a certain percentage of said logic swing, said resistive bias circuit means including a first biasing network connected to said common current point for establishing a known biasing potential thereat and a second biasing network connected to said cross coupling means for establishing a given biasing potential thereat, said resistive bias circuit means maintaining said first holding transistor conducting and said second holding transistor reverse biased to provide a first stable set state for the multivibrator and maintaining said first holding transistor reverse biased and said second holding transistor conducting to provide a second stable reset state for the multivibrator, said first triggering transistor and said first holding transistor providing parallel current paths in said multivibrator when said multivibrator is being switched to one of its two stable states and said second triggering transistor and said second holding transistor providing parallel current paths in said multivibrator when said multivibrator is being switched into the other of its two stable states, said first triggering transistor and said first holding transistor carrying equal currents when said set binary input signal reaches a certain voltage level within said logic swing and said second triggering transistor and said second holding transistor carrying equal currents when said reset binary logic signal reaches a certain voltage level within said logic swing.

6. A bistable multivibrator constructed as an integrated circuit semiconductor device, said multivibrator having set and reset conductive states and including in combination, first and second signal output transistors having emitter, base and collector electrodes and first and second holding transistors having emitter, base and collector electrodes, said emitter electrodes of said first and second holding transistors being connected to a common point, conductive means cross coupling said emitter electrode of said first signal output transistor to said base electrode of said second holding transistor and further connecting said emitter electrode of said second signal output transistor to said base electrode of said first holding transistor, first and second base bias resistors connected respectively between said base electrodes of said first and second signal output transistors and a point of reference potential, said collector electrodes of said first and second signal output transistors being connected to said point of reference potential, a first triggering transistor having emitter, base and collector electrodes and connected with the emitter-to-collector path thereof in parallel with said first holding transistor, a second triggering transistor having emitter, base and collector electrodes and connected with the emitter-to-collector path thereof in parallel with said second holding transistor, said first and second triggering transistors being adapted to receive binary logic signals having upper and lower voltage levels defining a logic swing for changing the conductive state of said multivibrator, resistive bias circuit means including a first biasing network connected to said first and second triggering transistors for providing a bias potential thereat so that said triggering transistors conduct only in response to logic signals applied thereto which reach a predetermined level within said logic swing, said first biasing network being connected to said common point for establishing a known potential thereat, said resistive bias circuit means further including a second biasing network having first and second resistors connected respectively to said base electrodes of said first and second holding transistors for establishing a given potential at said first and second holding transistors, said resistive circuit means maintaining one of said first and second holding transistors conducting and maintaining the other of said first and second holding transistors reverse biased.

7. The multivibrator according to claim 6 wherein said first and second base bias resistors and said first and second resistors of said second biasing network all have the same resistance value.

8. The multivibrator according to claim 6 wherein said first biasing network includes a first resistor connected between voltage supply means and said emitter electrodes of said first and second triggering transistors, and a second resistor connected between said emitter electrodes of said first and second triggering transistors and said common point; said first resistor of said first biasing network being substantially larger in value than said second resistor of said first biasing network and providing a substantially constant current through first and second triggering transistors; said first and second resistors of said second biasing network having a value twice as large as the value of said second resistor in said first biasing network.

9. The multivibrator according to claim 6 wherein said emitter electrodes of said first and second triggering transistors are connected directly to said common current point; said first biasing network includes a resistor connected between voltage supply means and said common current point; said conductive means includes a third resistor connected between said base electrode of said first holding transistor and said emitter electrode of said second signal output transistor and a fourth resistor connected between said base electrode of said second holding transistor and said emitter electrode of said first signal output transistor; said third and fourth resistors providing a desired potential drop between said emitter electrodes of said first and second signal output transistors and said base electrodes of said second and first holding transistors to insure that a first known difference of potential exists between the base electrode of one of said first and second holding transistors and said common current point and that a second known difference of potential exists between the base electrode of the other of said first and second holding transistors and said common current point.

References Cited by the Examiner

UNITED STATES PATENTS

| | | | |
|---|---|---|---|
| 3,143,669 | 8/1964 | Gavern et al. | 307—88.5 |
| 3,215,938 | 11/1965 | Spencer et al. | 307—88.5 |
| 3,218,613 | 11/1965 | Gribble et al. | 307—88.5 |
| 3,259,761 | 7/1966 | Narud et al. | 307—88.5 |

OTHER REFERENCES

"Feedback Stabilizes Flip-Flop" by Philip Cheilik, Electronics, May 9, 1958, p. 92, relied on.

Motorola Specification Sheet MC302G, August 1963, by Motorola Semiconductor Products, Inc. 2 sheets.

ARTHUR GAUSS, *Primary Examiner.*

R. H. EPSTEIN, *Assistant Examiner.*